United States Patent [19]

Hayakawa et al.

[11] Patent Number: 4,569,721

[45] Date of Patent: Feb. 11, 1986

[54] METHOD FOR THE PRODUCTION OF SEMICONDUCTOR LASERS

[75] Inventors: Toshiro Hayakawa; Nobuyuki Miyauchi; Seiki Yano; Takahiro Suyama, all of Nara, Japan

[73] Assignee: Sharp Kabushiki Kaisha, Osaka, Japan

[21] Appl. No.: 644,437

[22] Filed: Aug. 27, 1984

[30] Foreign Application Priority Data

Aug. 30, 1983 [JP] Japan .................. 58-160681

[51] Int. Cl.[4] .................. H01L 21/306; B44C 1/22; C03C 15/00; C03C 25/06
[52] U.S. Cl. .................. 156/649; 29/569 L; 29/580; 148/175; 156/653; 156/657; 156/659.1; 156/662; 357/17; 357/56; 427/87
[58] Field of Search .................. 156/610, 612–614, 156/DIG. 103, DIG. 104, 633, 649, 652, 653, 657, 659.1, 662; 29/569 L, 576 E, 580; 427/86, 87, 255.1, 255.2, 255.3; 148/175, DIG. 48; 357/16, 17, 19, 30, 56

[56] References Cited

U.S. PATENT DOCUMENTS 4,404,730  9/1983  Heimen .................. 29/576 E
4,425,650  1/1984  Mito et al. .................. 29/569 L Primary Examiner—William A. Powell
Attorney, Agent, or Firm—Lyon & Lyon

[57] ABSTRACT

A method for the production of semiconductor lasers comprising: (a) forming a substrate having a striped portion on its face, said striped portion being formed into a mesa, (b) forming a current blocking layer on each of said striped portion and the remaining face of said substrate, (c) eliminating said current blocking layer only on said striped portion thereby allowing electric current to flow through the substrate and form said striped portion into a terrace or a groove, as a whole, and (d) successively laminating crystal growth layers for laser operation on the whole face of the substrate in strict conformity with said terrace or groove on the face of said substrate, thereby attaining stabilization of the transverse mode of laser oscillation.

6 Claims, 7 Drawing Figures

METHOD FOR THE PRODUCTION OF SEMICONDUCTOR LASERS

BACKGROUND OF THE INVENTION

1. Field of the Invention

This invention relates to a method for the production of semiconductor lasers having a structure, which is effective to control a transverse mode of laser oscillation, by the use of a crystal growth technique for the formation of thin films such as molecular beam epitaxy or metal-organic chemical vapor deposition.

2. Description of the Prior Art

Recently, a single crystal growth technique for the formation of thin films such as molecular beam epitaxy (MBE), metal-organic chemical vapor deposition (MO-CVD), etc. has been developed which enables the formation of thin film growth layers having a thickness of as thin as approximately 10 Å. The development of such a technique, although these significantly thin films have not yet been produced by liquid phase epitaxy (LPE), allowed the thin films to be applied to lasers, resulting in laser devices exhibiting new laser effects and/or superior laser characteristics. A typical example of these new laser devices is a quantum well (QW) laser, which is produced based on the fact that quantization levels are established in its active layer by reducing the thickness of the active layer from several hundred Å to approximately 100 Å or less and which is advantageous over conventional double heterostructure lasers in that the threshold current level is low and the temperature and transient characteristics are superior. Such a quantum well laser is described in detail in the following papers:

(1) W. T. Tsang, Applied Physics Letters, vol. 39, No. 10 pp. 786 (1981).

(2) N. K. Dutta, Journal of Applied Physics, vol. 53, No. 11, pp. 7211 (1982), and (3) H. Iwamura, T. Saku, T. Ishibashi, K. Otuka, Y. Horikoshi, Electronics Letters, vol. 19, No. 5, pp. 780 (1983).

As mentioned above, the single crystal growth technique, such as molecular beam epitaxy or metal-organic chemical vapor deposition, has resulted in the practical use of high quality semiconductor lasers having a new multiple-layered structure. However, the semiconductor laser is deficient in that a stabilized transverse mode of laser oscillation cannot be attained due to its multiple-layered structure.

One of the most important points requiring improvement in other conventional semiconductor lasers which are in practical use, is stabilization of the transverse mode of the laser oscillation. A contact stripe geometric laser, which was developed in the early stage of laser development, has a striped electrode to prevent electric current injected from transversely expanding, and attains a laser oscillation in a zero order mode (i.e., a fundamental transverse mode) upon exceeding the threshold current level, due to gains required for the laser osciation are greater than losses within the active region underneath the stripe region, while the said contact stripe geometric laser produces a laser oscillation in an expanded transverse mode or a higher-order transverse mode with an increase in the injection of current beyond the threshold current level, because carriers which are injected into the active layer spread to the outside of the striped region resulting in expanding the high gain region. Due to such an unstable transverse mode and dependency of the transverse mode upon the amount of injected electric current, the linear relationship between the injected electric current and the laser output decreases. Moreover, the laser output resulting from pulse modulation is unstable so that the signal-noise ratio is reduced and its directivity becomes too unstable to be used in an optical system such as optical fibers, etc. In order to overcome the above-mentioned practical drawbacks of contact stripe geometric lasers, a variety of structures for semiconductor lasers of GaAlAs and/or InGaAsP systems have been already produced by liquid phase epitaxy, which prevent not only electric current but also a light from transversely expanding thereby attaining stabilization in the transverse mode. However, most of these semiconductor lasers can only be produced by the growth of thin film layers on a grooved substrate, a mesa substrate or a terraced substrate based on a peculiarity of the liquid phase epitaxy, typical examples of which are channel-substrate planar structure injection lasers (CSP lasers) (K. Aiki, M. Nakamura, T. Kuroda and J. Umeda, Applied Physics Letters, vol. 30, No. 12, pp. 649 (1977)), constricted double heterojunction lasers (CDH lasers) (D. Botez, Applied Physics Letters, vol. 33, pp. 872 (1978)) and terraced substrate lasers (TS lasers) (T. Sugino, M. Wada, H. Shimizu, K. Itoh, and I. Teramoto, Applied Physics Letters, vol. 34, No. 4, (1979)). All of these lasers can be only produced utilizing anisotrophy of the crystal growth rate, but not produced by the use of a crystal growth technique such as molecular beam epitaxy (MBE) or metal-organic chemical vapor deposition (MO-CVD).

SUMMARY OF THE INVENTION

The method of this invention which overcomes the above-discussed disadvantages and numerous other drawbacks and deficiencies of the prior art, relates to a method for the production of semiconductor lasers comprising:

(a) forming a substrate having a striped portion on its face, said striped portion being formed into a mesa, (b) forming a current blocking layer on each of said striped portion and the remaining face of said substrate, (c) eliminating said current blocking layer only on said striped portion thereby allowing electric current to flow through the substrate and form said striped portion into a terrace or a groove, as a whole, and (d) successively laminating crystal growth layers for laser operation on the whole face of the substrate in strict conformity with said terrace or groove on the face of said substrate.

The semiconductor layers consist, in a preferred embodiment, of one selected from GaAlAs, InGaP, InGaAlP, InAlAs, InGaAs and InGaAsP systems.

The semiconductor layers are, in a preferred embodiment, grown by molecular beam epitaxy or metal-organic chemical vapor deposition.

Thus, the invention described herein makes possible the objects of (1) providing a method for the production of semiconductor lasers having a stabilized transverse mode and (2) providing a method for the production of the above-mentioned semiconductor lasers by molecular beam epitaxy or metal-organic chemical vapor deposition.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
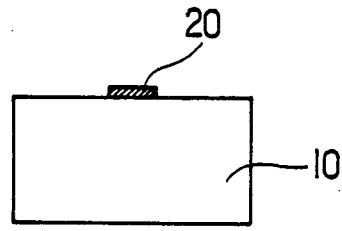
FIGS. 1 to 5, respectively, are diagrammatical sectional views showing the production process of a semiconductor laser according to this invention.
Figure 2:
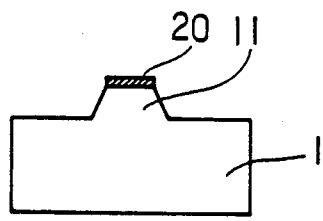
Figure 3:
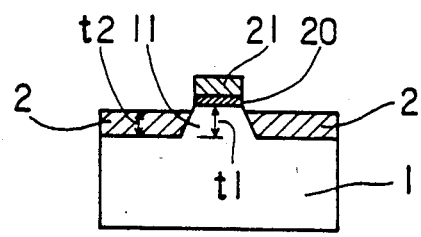

The semiconductor laser of this invention is produced as follows:

As show in FIG. 1, a striped $Si_3N_4$ film 20 is formed on a p-GaAs substrate 10 by a photolithography method. Then, the remaining portion of the substrate 10 which has not been masked by the striped $Si_3N_4$ film 20 is mesa-etched by a well known etching technique, as shown in FIG. 2, resulting in a substrate 1 having a striped portion formed into a mesa 11, on the top of which the striped $Si_3N_4$ film 20 remains. On the mesa substrate 1 having the $Si_3N_4$ film 20 thereon, n-GaAs current blocking layers 2 and 21 are grown by molecular beam epitaxy, as shown in FIG. 3, in such a manner that the thickness $t_2$ of the n-GaAs layer 2 is smaller than the height $t_1$ of the mesa portion 11. The thickness of the said layers can be easily controlled using a molecular beam epitaxy method. The n-GaAs layer 21, which is grown on the $Si_3N_4$ film 20 concurrently with the n-GaAs layer 2 on the substrate 1, except the mesa portion 11, does not crystallize in a single crystal structure but crystallizes in a polycrystal structure.

Figure 4:
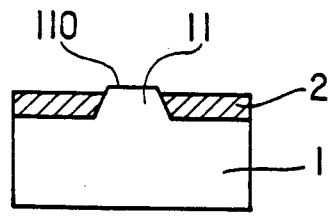

Then, using an etchant such as hydrochloric acid, the $Si_3N_4$ film 20 is removed together with the n-GaAs layer 21 thereon resulting in the n-GaAs layer 2 alone remaining on the substrate 1 as shown in FIG. 4. In this etching process, selective etching can be carried out if a proper etchant is employed. Since $t_1$ is greater than $t_2$, the mesa portion 11 of the substrate 1 forms in a terrace 110 structure even though the n-GaAs layer 2 remains on the substrate 1.

Figure 5:
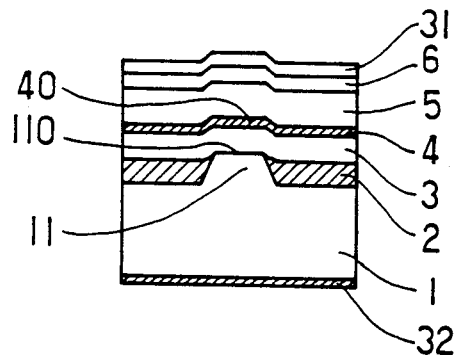

Then, on the substrate 1 shown in FIG. 4, a p-$Ga_{0.7}Al_{0.3}As$ cladding layer 3 (the thickness thereof being 1 $\mu$m), a non-doped GaAs active layer 4 (the thickness thereof being 0.08 $\mu$m), a n-$Ga_{0.7}Al_{0.3}As$ cladding layer 5 (the thickness thereof being 1 $\mu$m) and a n-GaAs cap layer 6 (the thickness thereof being 0.5 $\mu$m) are successively formed by a molecular beam epitaxy, followed by the formation of a n-type electrode 31 and a p-type electrode 32 on the surface of the n-GaAs cap layer 6 and the back face of the substrate 1 by an evaporation process, respectively, resulting in a semiconductor laser as shown in FIG. 5.

Using molecular beam epitaxy, as described above, each of the growth layers successively formed on the substrate 1 having a terrace 110 shown in FIG. 4 consequently conforms to the terraced form of the substrate 1 as seen from FIG. 5. The resulting active layer 4, which is constricted at both sides of the region therein corresponding to the terrace 110 of the substrate 1, forms a striped region 40, serving as a light waveguide to stabilize the transverse mode of the laser oscillation. The light waveguide in the active layer 4 is adjusted in position to the stripe into which an electric current is injected, while the injected electric current is blocked by the n-GaAs current blocking layer 2 and flows through the mesa portion 11 alone of the substrate 1. Thus, the semiconductor laser results in a structure which is superior to the stabilization of the transverse mode.

Figure 6:
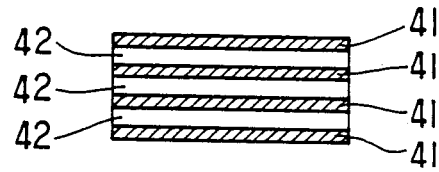
FIG. 6 is a sectional view showing an active layer having a quantum-well heterostructure of another semiconductor laser according to this invention.

As shown in FIG. 6, as an active layer, a quantum-well heterostructure consisting of, for example, a combination of plural non-doped GaAs well layers 41 (the thickness of each layer being 100 Å) and plural non-doped $Ga_{0.8}Al_{0.2}As$ barrier layers 42 (the thickness of each layer being 30 Å) can be used, instead of the non-doped GaAs active layer 4 shown in FIG. 5, thereby obtaining a semiconductor laser exhibiting a quantum-well effect and a stabilized transverse mode.

Figure 7:
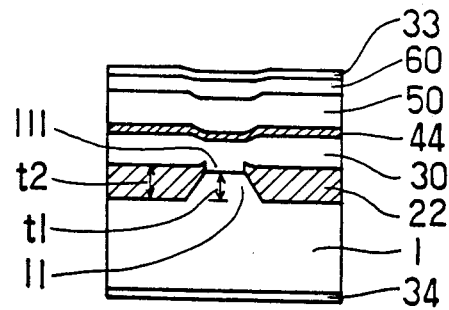
FIG. 7 is a sectional view showing another semiconductor laser according to this invention.

Alternatively, as shown in FIG. 7, an n-GaAs current blocking layer 22 can be grown on the substrate 1 in such a manner that a thickness $t_2$ of the n-GaAs layer 22 is greater than a height $t_1$ of the mesa portion 11 of the substrate 1, in contrast to the afore-mentioned example, resulting in the formation of a groove 111 on the face of the substrate 1. By the use of molecular beam epitaxy in the same manner as in the afore-mentioned, growth layers such as a p-$Ga_{0.7}Al_{0.3}As$ cladding layer 30, a non-doped GaAs active layer 44, a non-$Ga_{0.7}Al_{0.3}As$ cladding layer 50 and a n-GaAs cap layer 60 can be successively formed on the whole face of the substrate 1 in strict conformity with the grooved form of the substrate 1, producing a light waveguide in the active layer 44. Then, an n-type electrode 33 and a p-type electrode 34 are likewise formed on the n-GaAs cap layer 6 and the back face of the substrate 1, respectively.

Although GaAlAs-semiconductor lasers produced using molecular beam epitaxy were only described in the afore-mentioned examples, they can be also produced using metal-organic chemical vapor deposition or other crystal growth techniques in such a manner that the growth layers conform to a terraced or grooved form of the face of the substrate. This invention is also applicable to other semiconductor lasers of InGaP, InGaAlP, InAlAs, InGaAs or InGaAsP systems, or the like, in addition to the GaAlAs system.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. A method for the production of semiconductor lasers comprising:
   (a) forming a substrate having a striped portion on its face, said striped portion being formed into a mesa,
   (b) forming a current blocking layer on each of said striped portion and the remaining face of said substrate,
   (c) eliminating said current blocking layer only on said striped portion thereby allowing electric current to flow through the substrate and form said striped portion into a terrace or a groove, as a whole, and (d) successively laminating crystal growth semiconductor layers for laser operation on the whole face of the substrate in strict conformity with said terrace or groove on the face of said substrate.

2. A method according to claim 1, wherein said semiconductor layers consist of one selected from the GaAlAs, InGaP, InGaAlP, InAlAs, InGaAs and InGaAsP systems.

3. A method according to claim 1, wherein said semiconductor layers are grown by molecular beam epitaxy deposition.

4. A method according to claim 2, wherein said semiconductor layers are grown by molecular beam epitaxy deposition.

5. A method according to claim 1, wherein said semiconductor layers are grown by metal-organic chemical vapor deposition.

6. A method according to claim 2, wherein said semiconductor layers are grown by metal-organic chemical vapor deposition.

* * * * *